United States Patent
Noda et al.

(10) Patent No.: US 7,141,862 B2
(45) Date of Patent: Nov. 28, 2006

(54) SEMICONDUCTOR DEVICE AND METHOD FOR MANUFACTURING THE SAME

(75) Inventors: Takafumi Noda, Shiojiri (JP);
Masahiro Hayashi, Sakata (JP);
Akihiko Ebina, Fujimi-machi (JP);
Masahiko Tsuyuki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/890,403

(22) Filed: Jul. 13, 2004

(65) Prior Publication Data

US 2005/0029616 A1    Feb. 10, 2005

(30) Foreign Application Priority Data

Jul. 14, 2003   (JP)   ............... 2003-274072

(51) Int. Cl.
*H01L 29/00*   (2006.01)
(52) U.S. Cl. ............... 257/500; 257/391; 257/392; 257/296
(58) Field of Classification Search ............... None
See application file for complete search history.

(56) References Cited

U.S. PATENT DOCUMENTS

| | | | |
|---|---|---|---|
| 6,033,971 A | * | 3/2000 | Motonami et al. ......... 438/444 |
| 6,531,356 B1 | * | 3/2003 | Hayashi ...................... 438/228 |
| 6,780,717 B1 | * | 8/2004 | Yasuoka et al. ............. 438/276 |
| 6,906,398 B1 | * | 6/2005 | Yeo et al. .................... 257/500 |
| 2003/0164858 A1 | * | 9/2003 | Klosterman et al. ........ 345/783 |
| 2004/0195632 A1 | * | 10/2004 | Sato ........................... 257/368 |
| 2005/0035394 A1 | * | 2/2005 | Mori .......................... 257/314 |

FOREIGN PATENT DOCUMENTS

JP   2003-51552   *   2/2003

* cited by examiner

*Primary Examiner*—Nathan J. Flynn
*Assistant Examiner*—Ahmad N. Sefer
(74) *Attorney, Agent, or Firm*—Harness, Dickey & Pierce, P.L.C.

(57) ABSTRACT

A semiconductor device is provided in which high breakdown voltage transistors and low voltage driving transistors are formed on the same substrate. The device includes a semiconductor layer, first element isolation regions for defining a high breakdown voltage transistor forming region in the semiconductor layer, second element isolation regions including trench dielectric layers for defining a low voltage driving transistor forming region in the semiconductor layer, high breakdown voltage transistors formed in the high breakdown voltage transistor forming region, low voltage driving transistors formed in the low voltage driving transistor forming region, and offset dielectric layers for alleviating the electric field of the high breakdown voltage transistors formed in the high breakdown voltage transistor forming region, wherein upper ends of the offset dielectric layers are beak shaped.

5 Claims, 19 Drawing Sheets

SEMICONDUCTOR DEVICE AND METHOD FOR MANUFACTURING THE SAME

RELATED APPLICATIONS

This application claims priority to Japanese Patent Application No. 2003-274072 filed Jul. 14, 2003 which is hereby expressly incorporated by reference herein in its entirety.

BACKGROUND

1. Technical Field of the Invention

The present invention relates to a semiconductor device equipped with MOS transistors (Metal Oxide Semiconductors) having different drain breakdown voltages on the same semiconductor layer, and a method for manufacturing the same.

2. Background Technology

Currently, field effect transistors with LOCOS (Local Oxidation Of Silicon) offset structure are known as field effect transistors that are designed to have a higher breakdown voltage. A field effect transistor having a LOCOS offset structure is a transistor that is provided with a LOCOS layer between a gate dielectric layer and a drain region, and an offset impurity layer below the LOCOS layer.

Also, along with the trend of further weight-reduction and miniaturization of various electronic devices in recent years, there are demands in further reduction in the size of ICs to be mounted on these electronic devices. In particular, for driving ICs in electronic devices having liquid crystal display devices, technologies that reduce chip areas of the ICs through mix-mounting low voltage driving transistors for low voltage operation and high breakdown voltage transistors for high voltage operations on the same substrate (the same chip) are in strong demand. When a high breakdown voltage transistor provided with a LOCOS layer for alleviation of the electric fields described above and a low voltage driving transistor are formed on the same substrate, a semiconductor device of such a structure as described above can be manufactured through, for example, forming a LOCOS layer for element isolation and a LOCOS layer for alleviation of the electric fields in the same step.

However, due to the demands in further miniaturization in recent years, methods for forming element isolation regions are shifting from LOCOS methods to STI (Shallow Trench Isolation) methods, and a method in which LOCOS layers for alleviation of the electric fields of high breakdown voltage transistors are replaced with trench dielectric layers has been proposed.

It is an object of the present invention to provide a semiconductor device in which high breakdown voltage transistors and low voltage driving transistors are formed on the same substrate, and a semiconductor device and a method for manufacturing the same wherein LOCOS layers and trench dielectric layers are commonly used, such that further miniaturization and improved reliability can be achieved.

SUMMARY

A semiconductor device in accordance with the present invention includes: a semiconductor layer; a first element isolation region for defining a high breakdown voltage transistor forming region in the semiconductor layer, a second element isolation region including a trench dielectric layer for defining a low voltage driving transistor forming region in the semiconductor layer; a high breakdown voltage transistor formed in the high breakdown voltage transistor forming region; a low voltage driving transistor formed in the low voltage driving transistor forming region, and an offset dielectric layer for alleviating the electric field of the high breakdown voltage transistor formed in the high breakdown voltage transistor forming region, wherein an upper end of the offset dielectric layer has a bird's beak configuration or is beak shaped.

In the semiconductor device in accordance with the present invention, the offset dielectric layer for alleviating the electric field of the high breakdown voltage transistor forming region is provided, and an upper end of the offset dielectric layer has a bird's beak configuration. For example, in the case of forming a gate dielectric layer having a great film thickness above a trench dielectric layer having a large taper angle, thinning occurs at an upper end of the trench dielectric layer, and the film thickness of the gate dielectric layer may become partially thinner, and the reliability of semiconductor device may be damaged. However, in the semiconductor device of the present invention, an upper end of the offset dielectric layer has a bird's beak configuration, such that, even when a gate dielectric layer having a great film thickness is provided, the gate dielectric layer can be formed with a uniform film thickness. As a result, a highly reliable semiconductor device can be provided.

The present invention can assume the following embodiments, for example.

In the semiconductor device in accordance with the present invention, a first linear line extending along a side surface of the upper end of the offset dielectric layer and a second linear line extending along a surface of the semiconductor layer can define an angle of 15°–30°.

In the semiconductor device in accordance with the present invention, the offset dielectric layer can be a semi-recess LOCOS layer.

In the semiconductor device in accordance with the present invention, the first element isolation region can be a semi-recess LOCOS layer.

In the semiconductor device in accordance with the present invention, the offset dielectric layer can be a LOCOS layer.

In the semiconductor device in accordance with the present invention, the first element isolation region can be a LOCOS layer.

A method for manufacturing a semiconductor device in accordance with the present invention includes:
 a step of forming a first element isolation region for defining a high breakdown voltage transistor forming region in a semiconductor layer;
 a step of forming a second element isolation region by an STI method for defining a low voltage driving transistor forming region in the semiconductor layer;
 a step of forming a high breakdown voltage transistor in the high breakdown voltage transistor forming region;
 a step of forming a low voltage driving transistor in the low voltage driving transistor forming region; and
 a step of forming an offset dielectric layer by a selective oxidation method for alleviating electric filed of the high breakdown voltage transistor.

By the method for manufacturing a semiconductor device in accordance with the present invention, the second element isolation region in the low voltage driving transistor forming region is formed by an STI method, and the offset dielectric layer of the high breakdown voltage transistor is formed by a selective oxidation method. Accordingly, an upper end of the offset dielectric layer can be formed to have a bird's beak configuration. As a result, even when a gate dielectric layer having a great film thickness is formed over the offset dielectric layer, the gate dielectric layer can be formed with a uniform film thickness even at the upper end of the offset dielectric layer, and thus a highly reliable semiconductor device can be provided.

The present invention can assume the following embodiments, for example.

In the method for manufacturing a semiconductor device in accordance with the present invention, the offset dielectric layer can be formed by a semi-recess LOCOS method.

In the method for manufacturing a semiconductor device in accordance with the present invention, the offset dielectric layer can be formed by a LOCOS method.

In the method for manufacturing a semiconductor device in accordance with the present invention, the first element isolation region and the offset dielectric layer can be formed in the same process.

In the method for manufacturing a semiconductor device in accordance with the present invention, the second element isolation region can be formed after completing a heat treatment at a high temperature that is required for forming an impurity diffusion layer of the high breakdown voltage transistor forming region.

The method for manufacturing a semiconductor device in accordance with the present invention can include a step of, after the second element isolation region is formed, forming a gate dielectric layer for the high breakdown voltage transistor, wherein the gate dielectric layer may be formed by a thermal oxidation method after forming a protection film to cover at least the second element isolation region.

In the method for manufacturing a semiconductor device in accordance with the present invention, the protection film can be formed to have an opening above a channel region of the high breakdown voltage transistor, the offset dielectric layer, and semiconductor layers on both sides of the offset dielectric layer.

DETAILED DESCRIPTION

Next, an embodiment of the present invention will be described.

Semiconductor Device

Figure 1:
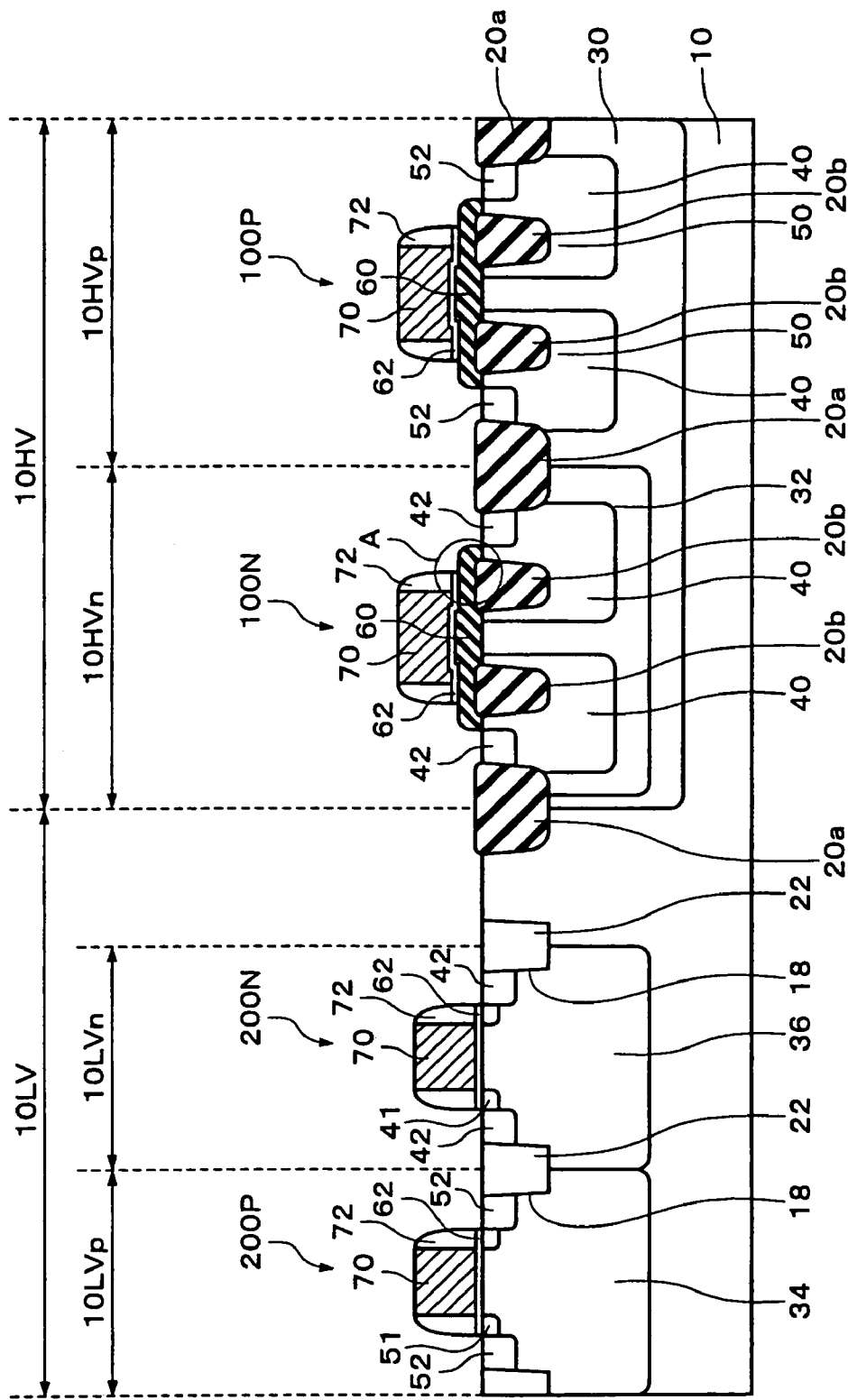
FIG. 1 schematically shows a cross-sectional view of a semiconductor device in accordance with an embodiment of the present invention.
Figure 2:
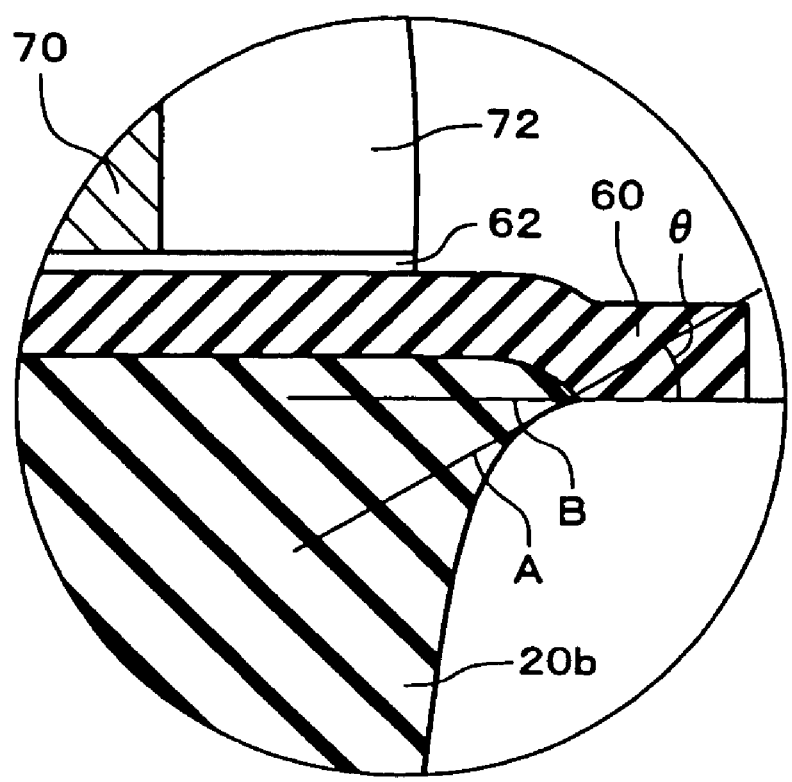
FIG. 2 shows an enlarged view of portion A of FIG. 1.

FIG. 1 schematically shows a cross-sectional view of a semiconductor device in accordance with an embodiment of the present invention. FIG. 2 shows an enlarged view of portion A of FIG. 1.

The semiconductor device in accordance with the embodiment of the present invention includes high breakdown voltage transistors 100P and N and low voltage driving transistors 200P and N mixed and mounted on a semiconductor substrate 10 that is a semiconductor layer. A high breakdown voltage transistor region 10HV and a low voltage driving transistor region 10LV are provided in the semiconductor substrate 10. The high breakdown voltage transistor region 10HV includes a P-channel high breakdown voltage transistor region 10HVp and an N-channel high breakdown voltage transistor region 10HVn. The low voltage driving transistor region 10LV includes a P-channel low voltage driving transistor region 10LVp and an N-channel low voltage driving transistor region 10LVn. A P-channel high breakdown voltage transistor 100P is formed in the P-channel high breakdown voltage transistor region 10HVp, and an N-channel high breakdown voltage transistor 100N is formed in the N-channel high breakdown voltage transistor region 10HVn. Similarly, a P-channel low voltage driving transistor 200P is formed in the P-channel low voltage driving transistor region 10LVp, and an N-channel low voltage driving transistor 200N is formed in the N-channel low voltage driving transistor region 10LVn.

More specifically, on the same substrate (on the same chip), the P-channel high breakdown voltage transistor 100P, the N-channel high breakdown voltage transistor 100N, the P-channel low voltage driving transistor 200P and the N-channel low voltage driving transistor 200N are mixed and mounted. It is noted that FIG. 1 shows only four transistors for the sake of convenience, but it goes without saying that a plurality of transistors in various kinds may be formed on the same substrate.

High Breakdown Voltage Transistor Region

First, the high breakdown voltage transistor region 10HV will be described. In the high breakdown voltage transistor region 10HV, the P-channel high breakdown voltage transistor region 10HVp and the N-channel high breakdown voltage transistor region 10HVn are provided. A first element isolation region 110 is provided between the adjacent high breakdown voltage transistor regions. More specifically, the first element isolation region 110 is provided between the adjacent P-channel high breakdown voltage transistor 100P and N-channel high breakdown voltage transistor 100N. The first element isolation region 110 is formed from a semi-recess LOCOS layer.

Next, the structure of the P-channel high breakdown voltage transistor 100P and the N-channel high breakdown voltage transistor 100N will be described.

The P-channel high breakdown voltage transistor 100P includes a gate dielectric layer 60, offset dielectric layers 20b including semi-recess LOCOS layers, a gate electrode 70, P-type low concentration impurity layers 50, sidewall dielectric layers 72, and P-type high impurity concentration layers 52.

The gate dielectric layer 60 is formed in a manner to cover areas above an N-type well 30 that forms a channel region, above the offset dielectric layers 20b, and above the semiconductor layer 10 on both sides of the offset dielectric layers 20b. The gate electrode 70 is formed at least above the gate dielectric layer 60. The P-type low concentration impurity layers 50 function as offset regions. The sidewall dielectric layers 72 are formed on side surfaces of the gate electrode 70. The P-type high concentration impurity layers 52 are provided outside the side wall dielectric layers 72. The P-type high concentration impurity layer 52 serves as a source region or a drain region (hereafter referred to as a "source/drain region").

The N-channel high breakdown voltage transistor 100N includes a gate dielectric layer 60, offset dielectric layers 20b, a gate electrode 70, N-type low concentration impurity layers 40, sidewall dielectric layers 72, and N-type high concentration impurity layers 42.

The gate dielectric layer 60 is formed in a manner to cover areas above a P-type well 32 that forms a channel region, above the offset dielectric layers 20b, and above the semiconductor layer 10 on both sides of the offset dielectric layers 20b. The gate electrode 70 is formed at least above the gate dielectric layer 60. The N-type low concentration impurity layers 40 function as offset regions. The sidewall dielectric layers 72 are formed on side surfaces of the gate electrode 70. The N-type high concentration impurity layers 42 are provided outside the side wall dielectric layers 72. The N-type high concentration impurity layer 42 serves as a source/drain region.

Next, referring to FIG. 2, the shape of the offset dielectric layers 20b that are used to alleviate the electric fields of the P-channel high breakdown voltage transistor 100P and the N-channel high breakdown voltage transistor 100N and the shape of end sections of the gate dielectric layer 60 will be described in greater detail First, the shape of the gate dielectric layer 60 will be described. As indicated in FIG. 2, the gate dielectric layer 60 is formed to cover the entire surface of the offset dielectric layers 20 and extend over the semiconductor layer 10 on both sides of the offset dielectric layers 20b. More specifically, an end section of the gate dielectric layer 60 is provided at a location that exceeds beyond the bird's beak section.

Figure 19:
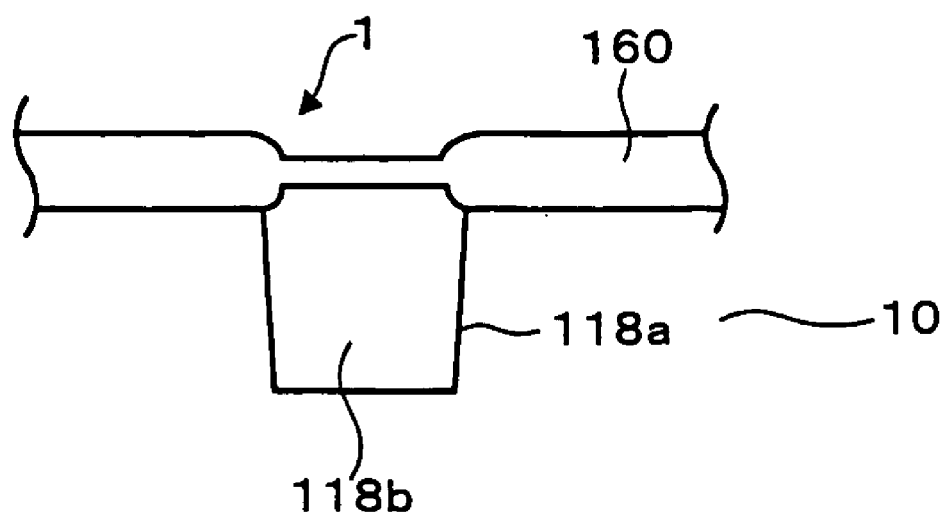
FIG. 19 schematically shows a cross-sectional view illustrating problems in a conventional example of a method for manufacturing a semiconductor device.

Next, the shape of the offset dielectric layer 20b will be described. A line extending along a side surface of the offset dielectric layer 20 at its upper end is assumed to be a first linear line A. A line extending along an upper surface of the semiconductor layer 10 is assumed to be a second linear line B. In the semiconductor device in accordance with the present embodiment, the offset dielectric layer 20b is formed such that the first linear line A and the second linear line B define an angle $\theta$ of 15–30°. If the angle $\theta$ defined between the first linear line A extending along the side surface of the offset dielectric layer 20b at its upper end and the second linear line B extending along the upper surface of the semiconductor substrate 10 exceeds 30°, the following problem occurs. To explain the problem, reference is made to FIG. 19 to describe, as an example, a situation where a gate dielectric layer 160 having a great film thickness is formed over an offset dielectric layer 118b embedded in a trench 118a, which is formed by a STI method. First, as indicated in FIG. 19, the offset dielectric layer 118b in which the angle $\theta$ defined between the first linear line A and the second linear line B is greater than 30° is formed by a STI method. In this instance, upper end sections of the offset dielectric layer 118b may be cut. If the gate dielectric layer 160 having a great film thickness is formed over the offset dielectric layer 118b in such a state, the film thickness of the gate dielectric layer 160 may become smaller than the desired film thickness at areas adjacent to boundary sections 1 between the offset dielectric layer 118b and the semiconductor substrate 10. (Hereafter, this phenomenon is called "thinning") Also, if the angle $\theta$ defined between the first linear line A and the second linear line B is smaller than 15°, the area occupied by the offset dielectric layer 20b becomes large, such that a semiconductor device cannot be sufficiently miniaturized.

Based on the foregoing, the offset dielectric layer 20b is shaped generally as an inverted truncate cone (frustum). The cone includes an essentially planar top surface adjacent the gate dielectric layer 60. The cone also includes divergent sidewalls adjacent the semiconductor material 10. The upper end of the sidewalls of the offset dielectric layer 20b (which are proximate the top surface) curve outwardly to flare toward a plane (represented by the Line B) substantially parallel to the top surface. The outer edge of the top surface of the offset dielectric layer 20b curves downwardly to meet the sidewalls. The convex top surface and concave sidewalls of the offset dielectric layer 20b combine to form a tapering arcuate lip having a vertex proximate the intersection of the gate dielectric layer 60 and the semiconductor material 10. The convex top surface preferably has a different radius of curvature than that of the concave sidewalls.

Low Voltage Driving Transistor Region

Next, the low voltage driving transistor region 10LV will be described. The low voltage driving transistor region 10LV is provided with a P-channel low voltage driving transistor region 10LVp and an N-channel low voltage driving transistor region 10LVn. A second element isolation region 210 is provided between the adjacent low voltage driving transistor regions. In other words, the second element isolation region 210 is provided between adjacent P-channel low voltage driving transistor 200P and N-channel low voltage driving transistor 200N. The second element isolation region 210 is formed by a STI method.

Next, the structure of each of the transistors will be described.

The N-channel low voltage driving transistor 200N includes a gate dielectric layer 62, a gate electrode 70, sidewall dielectric layers 72, N-type low concentration impurity layers 41, and N-type high concentration impurity layers 42.

The gate dielectric layer 62 is provided on a P-type well 36 that forms a channel region. The gate electrode 70 is formed on the gate dielectric layer 62. The sidewall dielectric layers 72 are formed on side surfaces of the gate electrode 70. The N-type low concentration impurity layers 41 and N-type high concentration impurity layers 42 form source/drain regions with LDD structure.

The P-channel low voltage driving transistor 200P includes a gate dielectric layer 62, a gate electrode 70, sidewall dielectric layers 72, P-type low concentration impurity layers 51, and P-type high concentration impurity layers 52.

The gate dielectric layer 62 is provided on an N-type well 34 that forms a channel region. The gate electrode 70 is formed on the gate dielectric layer 62. The sidewall dielectric layers 72 are formed on side surfaces of the gate electrode 70. The P-type low concentration impurity layers 51 and P-type high concentration impurity layers 52 form source/drain regions with LDD structure.

The semiconductor device in accordance with the present embodiment provides advantages as follows.

In the semiconductor device of the present invention, the offset dielectric layers 20b for alleviating the electric fields of the high breakdown voltage transistor forming region 10HV are provided, and an upper end of the offset dielectric layer 20b has a bird's beak configuration. For example, in the case of forming a gate dielectric layer 60 having a great film thickness above a trench dielectric layer having a large taper angle, thinning occurs at an upper end of the trench dielectric layer, and the film thickness of the gate dielectric layer may become partially thinner, and the reliability of semiconductor device may be damaged. However, in the semiconductor device of the present invention, an upper end of the offset dielectric layer 20b has a bird's beak configuration, such that, even when the gate dielectric layer 60 having a great film thickness is provided, the gate dielectric layer 60 can be formed with a uniform film thickness. As a result, highly reliable semiconductor devices can be provided. Also, the second element isolation region 210 is formed with the trench dielectric layer 22 in the low voltage driving transistor forming regions 10LV. According to this embodiment, the area of the low voltage driving transistor forming region 10LV can be made smaller. In other words, in accordance with the present embodiment, because the low voltage driving transistors 200P and N that can be miniaturized and the gate dielectric layer 60 with a uniform film thickness are formed, there can be provided a highly reliable semiconductor device in which the high breakdown voltage transistors 100P and N that can improve the reliability are provided on the same semiconductor substrate 10.

Method for Manufacturing a Semiconductor Device

Next, a method for manufacturing a semiconductor device in accordance with an embodiment of the present invention will be described with reference to FIGS. 3–18. FIGS. 3–18 schematically show cross-sectional views illustrating steps in the method for manufacturing a semiconductor device in accordance with the embodiment of the present invention.

Figure 3:
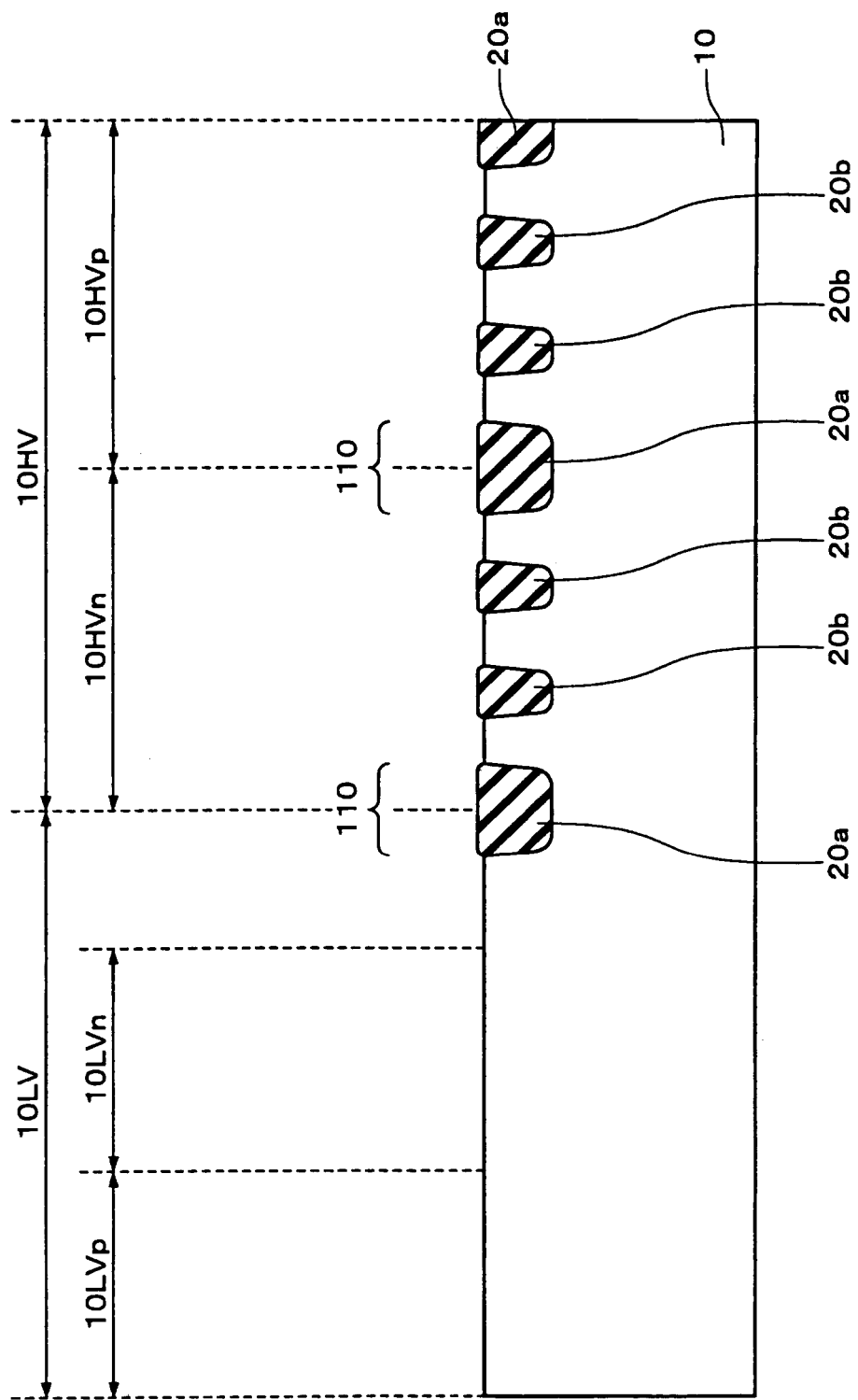
FIG. 3 schematically shows a cross-sectional view illustrating a step in the method for manufacturing a semiconductor device in accordance with the embodiment of the present invention.

First, as indicated in FIG. 3, semi-recess LOCOS layers 20a that serve to isolate elements and offset dielectric layers 20b for alleviating the electric fields are formed in a high breakdown voltage transistor forming region 10HV. An example of the method for forming the semi-recess LOCOS layers 20a and the offset dielectric layers 20b is described below.

First, a silicon oxinitride layer is formed by a CVD method on a semiconductor substrate 10. The film thickness of the silicon oxinitride layer may be 8–12nm, for example. Then, a silicon nitride layer is formed on the silicon oxinitride layer by a CVD method. Then, a resist layer (not shown) having openings at regions where the semi-recess LOCOS layers 20a and the offset dielectric layers 20b are to be formed is formed on the silicon nitride layer. Then, the silicon nitride layer, the silicon oxinitride layer and the semiconductor substrate 10 are etched by using the resist layer as a mask, thereby forming concave sections in the regions where the semi-recess LOCOS layers 20a and the offset dielectric layers 20b are formed. Then, the resist layer is removed.

Next, silicon oxide layers are formed by a thermal oxidation method on exposed surfaces of the semiconductor substrate 10, thereby forming, as shown in FIG. 3, the semi-recess LOCOS layers 20a as first element isolation regions 110 for defining a high breakdown voltage transistor forming region, and the offset dielectric layers 20b of high breakdown voltage transistors 100P and N.

Figure 4:
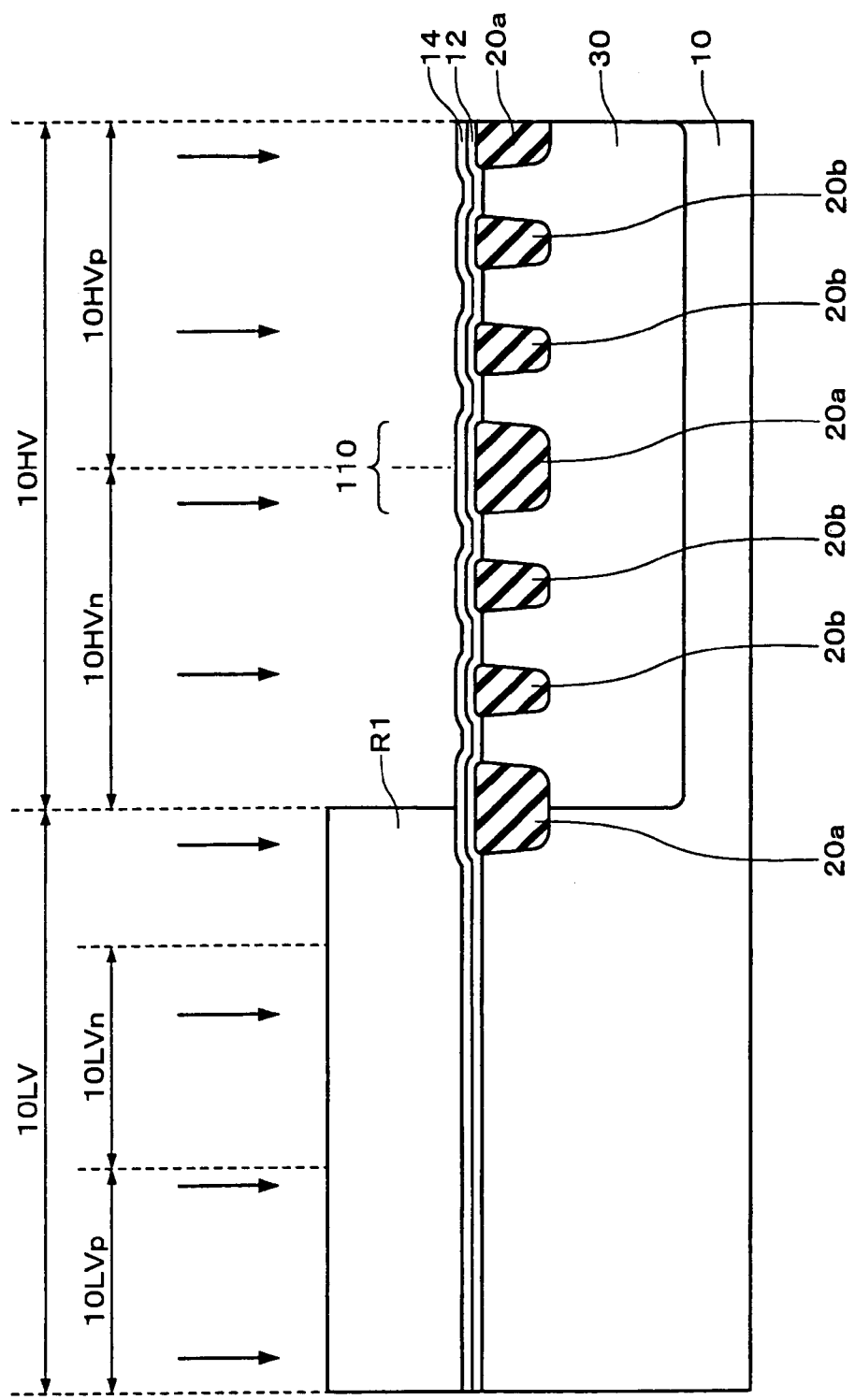
FIG. 4 schematically shows a cross-sectional view illustrating a step in the method for manufacturing a semiconductor device in accordance with the embodiment of the present invention.

Next, as shown in FIG. 4, an N-type well 30 is formed in the high breakdown voltage transistor region 10HV. First, a sacrificial oxide film 12 is formed over the entire surface of the semiconductor substrate 10. As the sacrificial oxide film 12, for example, a silicon oxide film may be formed. Then, on the entire surface in the high breakdown voltage transistor region 10HV and the low voltage driving transistor region 10LV, a silicon nitride film 14 is formed, a resist layer R1 having a specified pattern is formed, and N-type impurity such as phosphorous or arsenic is injected one time or plural times in the semiconductor substrate 10 by using the resist layer R1 as a mask, thereby forming the N-type well 30 in the semiconductor substrate 10. Then, the resist R1 is removed by, for example, ashing. Then, the N-type impurity is thermally diffused by a heat treatment.

Figure 5:
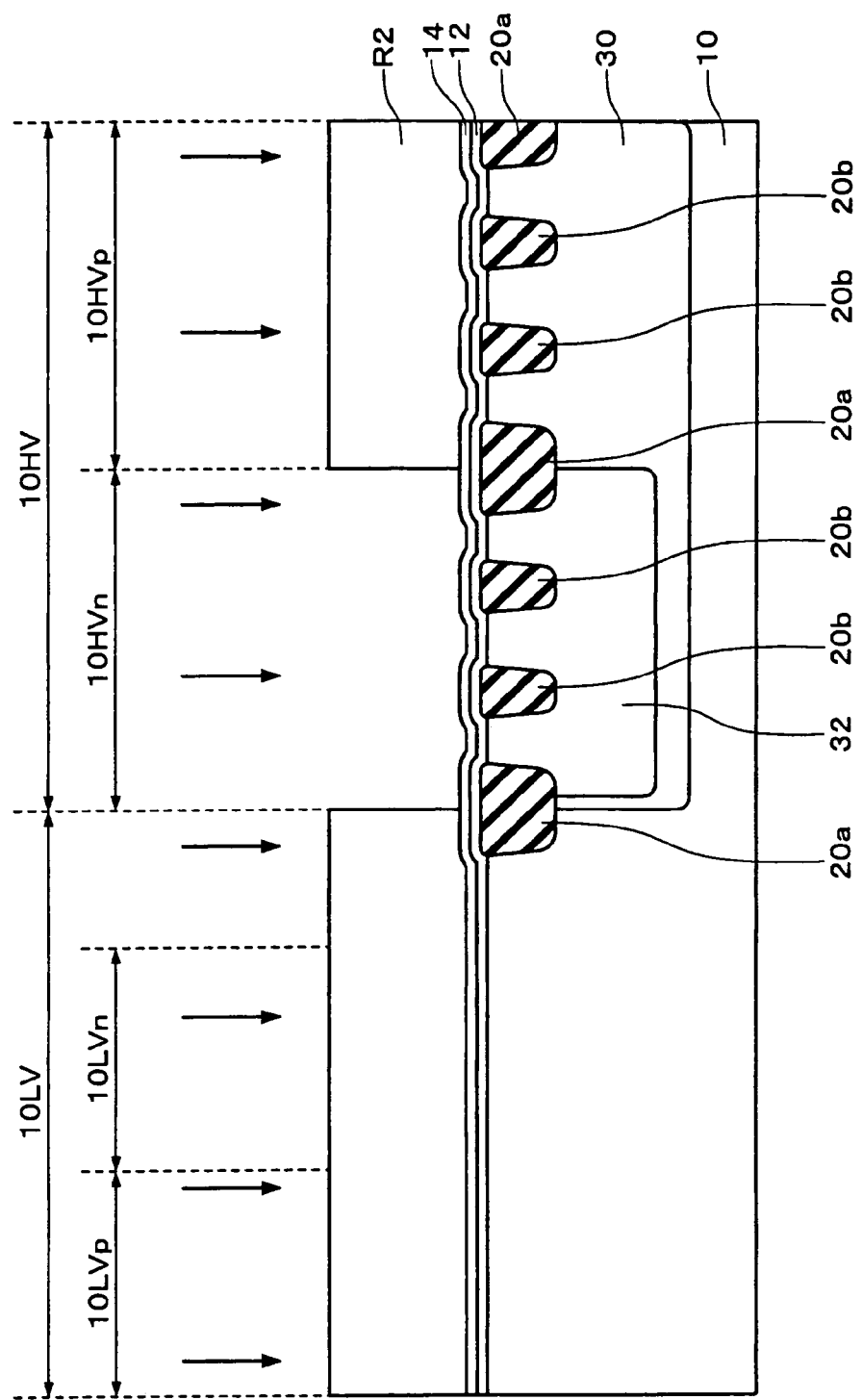
FIG. 5 schematically shows a cross-sectional view illustrating a step in the method for manufacturing a semiconductor device in accordance with the embodiment of the present invention.

Next, as shown in FIG. 5, a P-type well 32 is formed in the high breakdown voltage transistor region 10HV. First a resist layer R2 having a specified pattern is formed. P-type impurity ions are injected one time or plural times in the semiconductor substrate 10 by using the resist layer R2 as a mask, thereby forming the P-type well 32. Then, the resist layer R2 is removed by ashing. Then, the injected P-type impurity and the N-type impurity that has been injected before are thermally diffused at the same time by a heat treatment.

Figure 6:
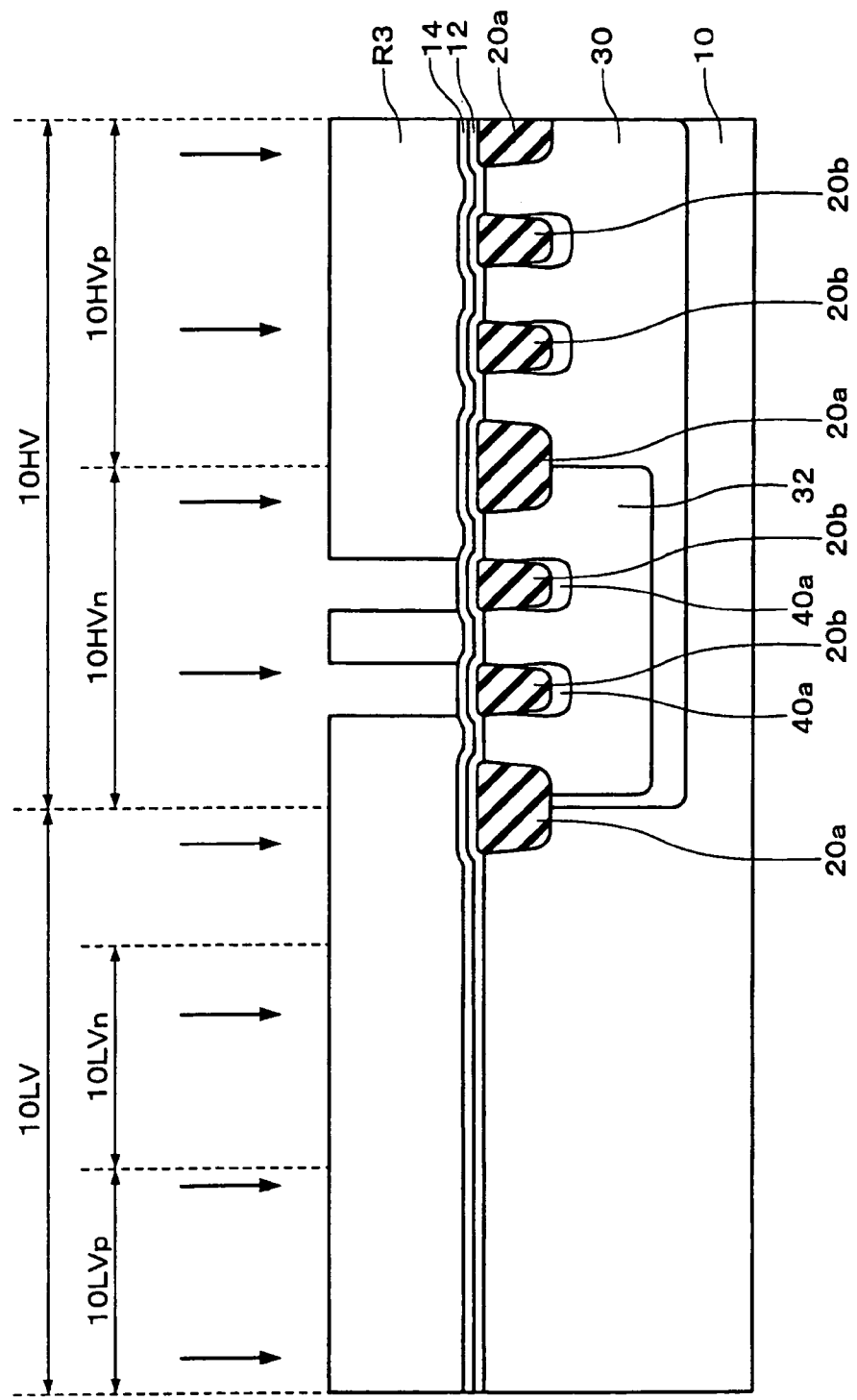
FIG. 6 schematically shows a cross-sectional view illustrating a step in the method for manufacturing a semiconductor device in accordance with the embodiment of the present invention.

Next, as shown in FIG. 6, impurity layers for offset regions of source/drain regions are formed in the high breakdown voltage transistor region 10HV.

First, a resist layer R3 that covers specified regions is formed. P-type impurity is introduced in the semiconductor substrate 10 by using the resist layer R3 as a mask, thereby forming impurity layers (not shown).

Then, the resist layer R3 is removed.

Figure 7:
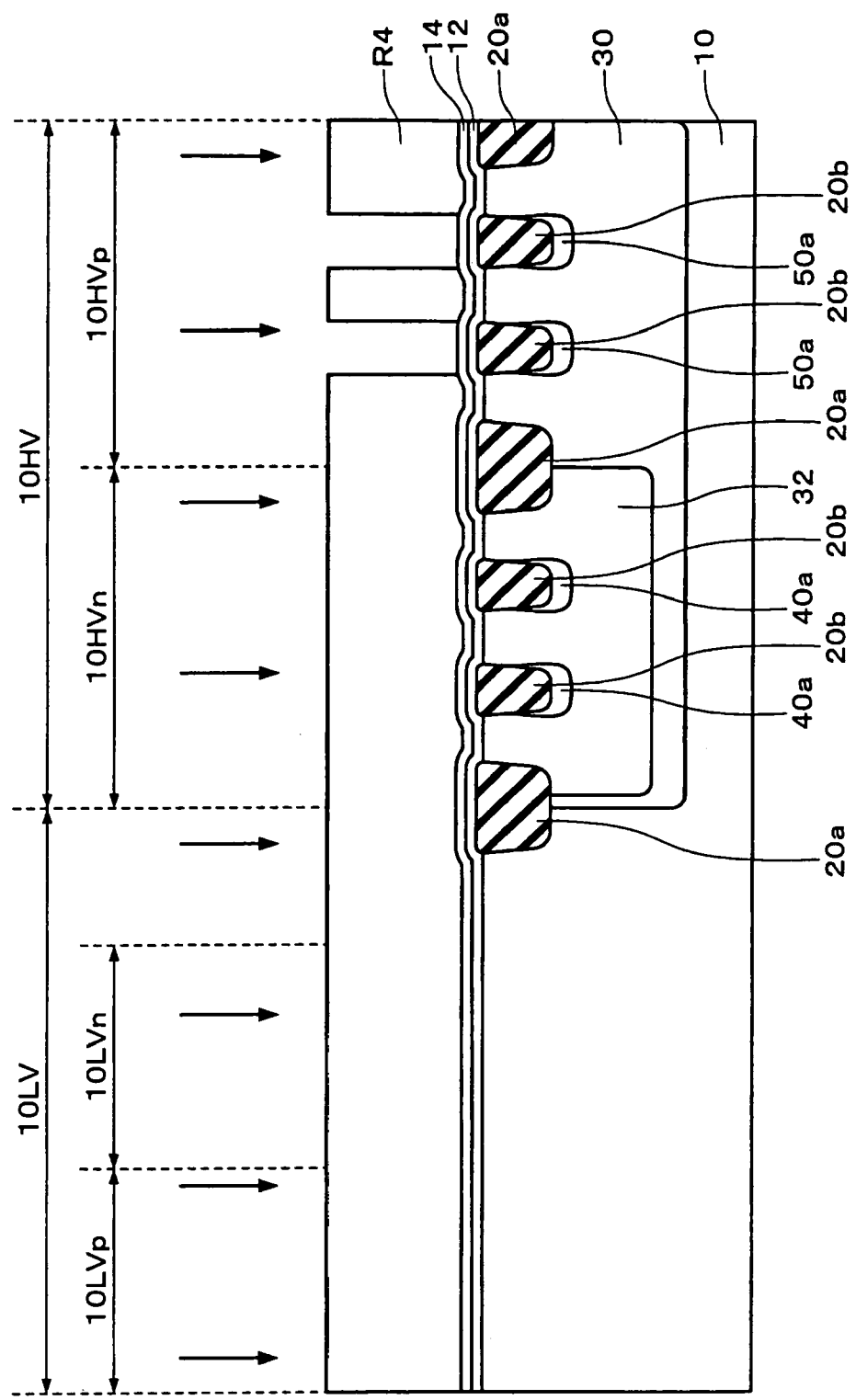
FIG. 7 schematically shows a cross-sectional view illustrating a step in the method for manufacturing a semiconductor device in accordance with the embodiment of the present invention.

Next, as shown in FIG. 7, a resist layer R4 that covers specified regions is formed. P-type impurity is introduced in the semiconductor substrate 10 by using the resist layer R4 as a mask. By this, impurity layers (not shown) for offset regions of source/drain regions are formed in the P-channel high breakdown voltage transistor region 10HVp.

Figure 8:
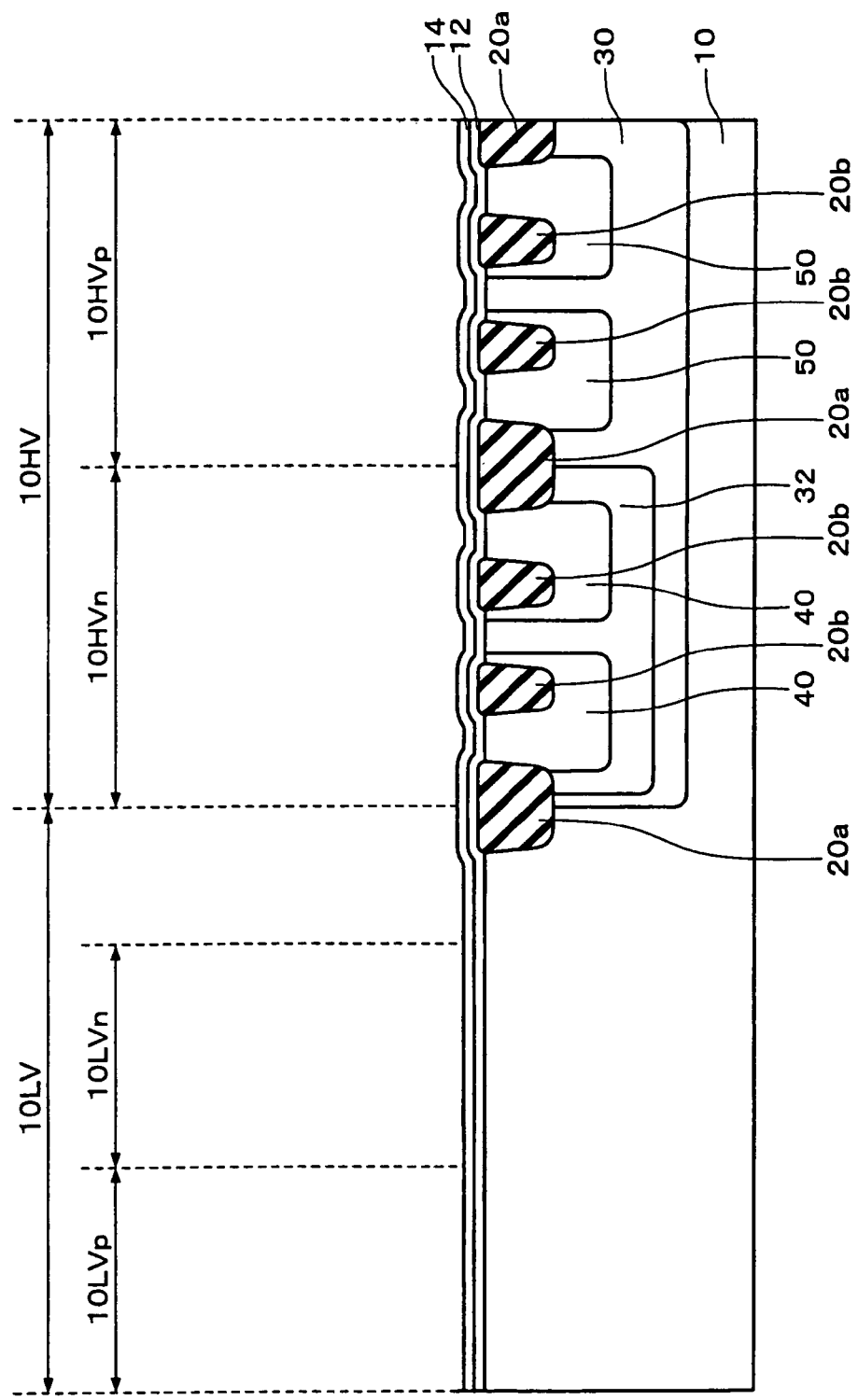
FIG. 8 schematically shows a cross-sectional view illustrating a step in the method for manufacturing a semiconductor device in accordance with the embodiment of the present invention.

Next, as shown in FIG. 8, by conducting a heat treatment according to a known technique, the impurity layers are diffused, such that low concentration impurity layers 40 and 50 that become offset regions of the high breakdown voltage transistors 100P and N are formed.

Then, the silicon nitride film 14 and the sacrificial oxide film 12 are removed by a known method.

Figure 9:
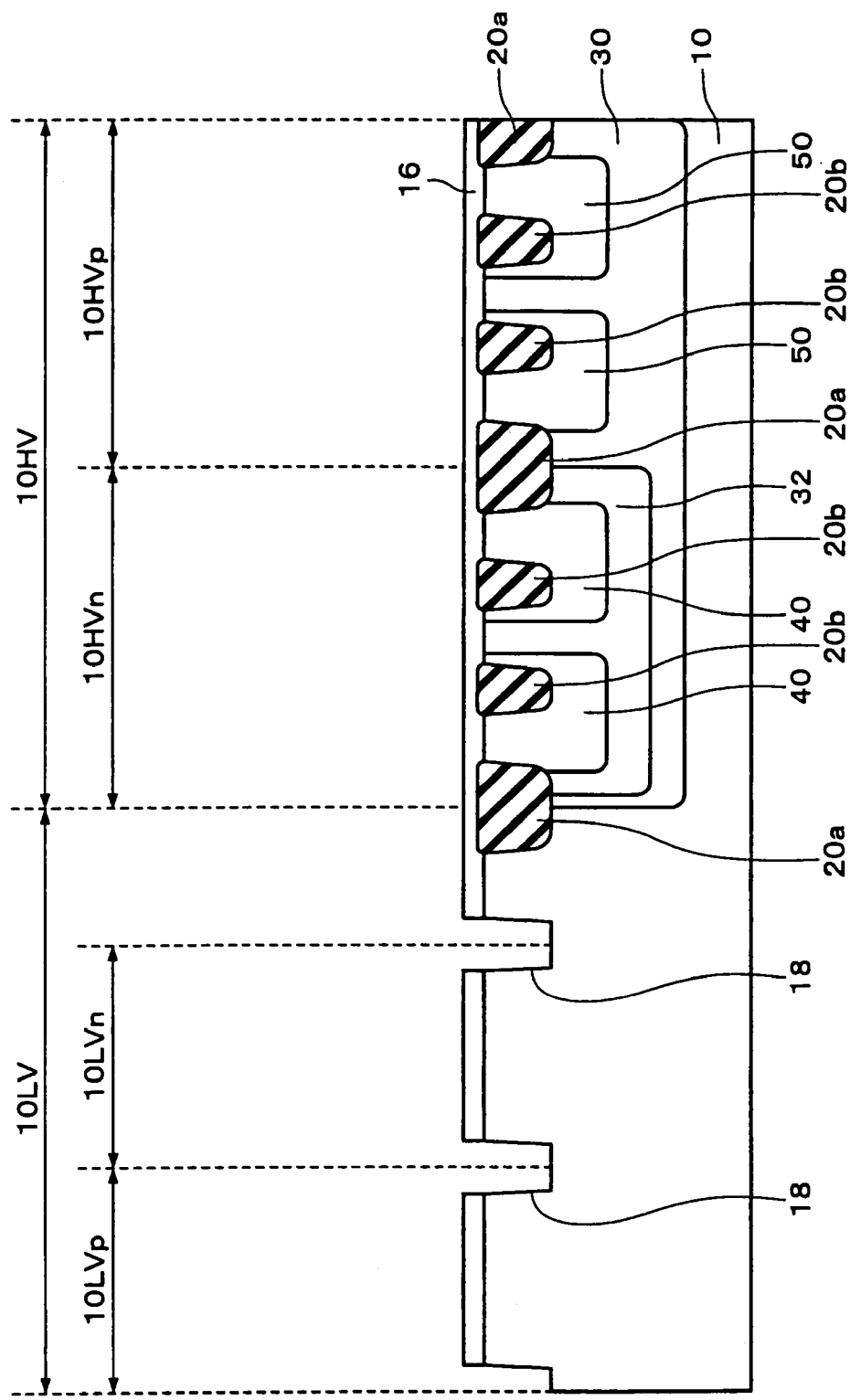
FIG. 9 schematically shows a cross-sectional view illustrating a step in the method for manufacturing a semiconductor device in accordance with the embodiment of the present invention.

Next, as indicated in FIG. 9, in the low voltage driving transistor forming region 10LV, trench dielectric layers 22 are formed, and second element isolation regions 210 are formed. First, a silicon oxide layer as a pad oxide film (not shown) is formed on the entire surface of the semiconductor substrate 10. Then, a stopper dielectric layer 16 is formed over the pad oxide film. A silicon nitride film may be formed as the stopper dielectric layer 16. The stopper dielectric layer 16 can be formed by, for example, a CVD method. Then, a mask layer (not shown) having openings in regions where the second element isolation regions 210 are to be formed is formed on the stopper dielectric layer 16. By using the mask layer as a mask, the stopper dielectric layer 16, the pad oxide film and the semiconductor substrate 10 are etched by a known etching technique, as shown in FIG. 9. By this, trenches 18 are formed.

Figure 10:
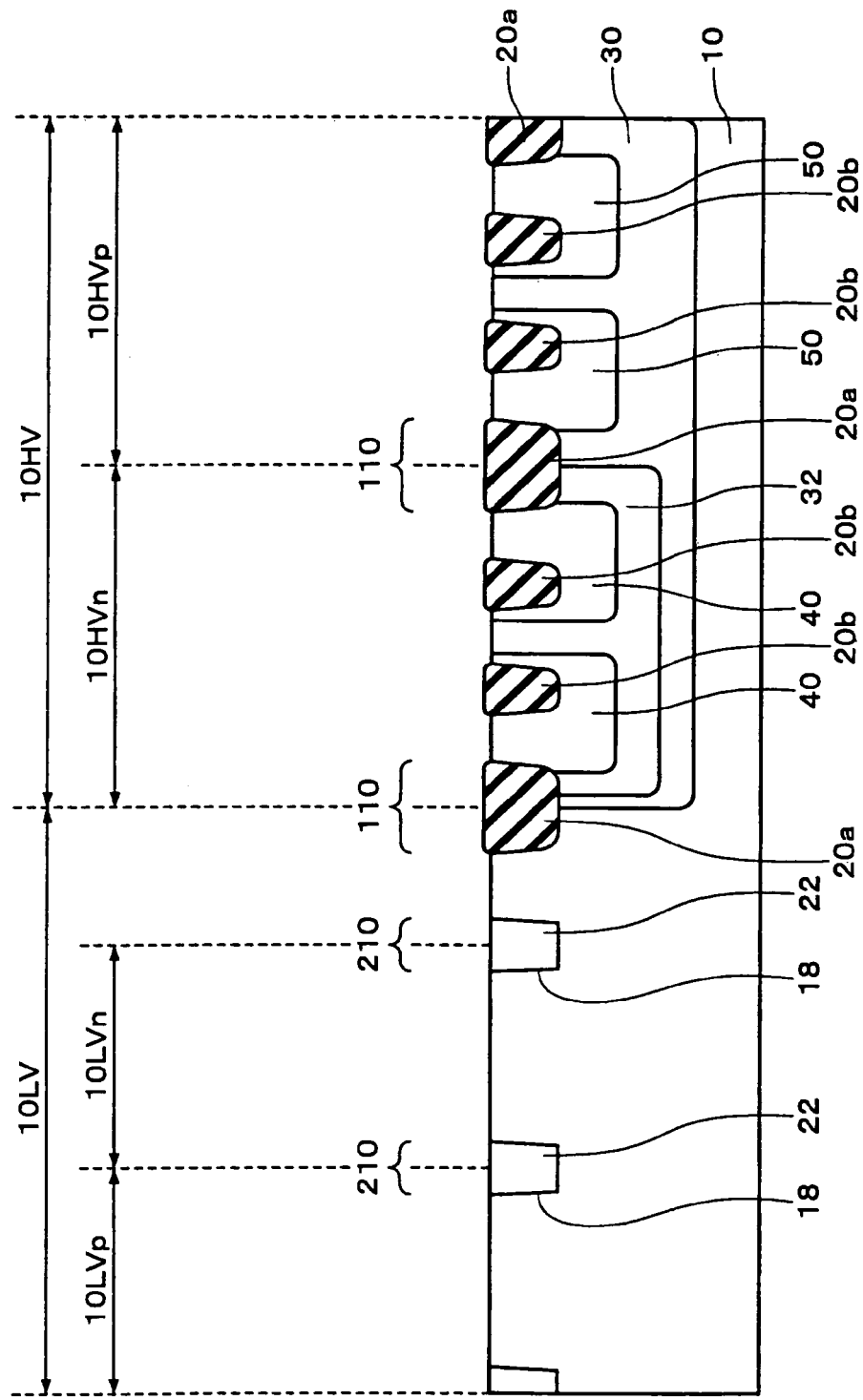
FIG. 10 schematically shows a cross-sectional view illustrating a step in the method for manufacturing a semiconductor device in accordance with the embodiment of the present invention.

Next, as shown in FIG. 10, trench oxide films (not shown) are formed on surfaces of the trenches 18. The trench oxide films may be formed by, for example, a thermal oxidation method. The film thickness of the trench oxide films may be 30–50nm, for example.

Then, a dielectric layer (not shown) is deposited on the entire surface in a manner to embed the trenches 18. By removing the deposited dielectric layer to a level that is generally at the same level as the surface of the semiconductor substrate 10, the trench dielectric layers 22 can be formed.

Figure 11:
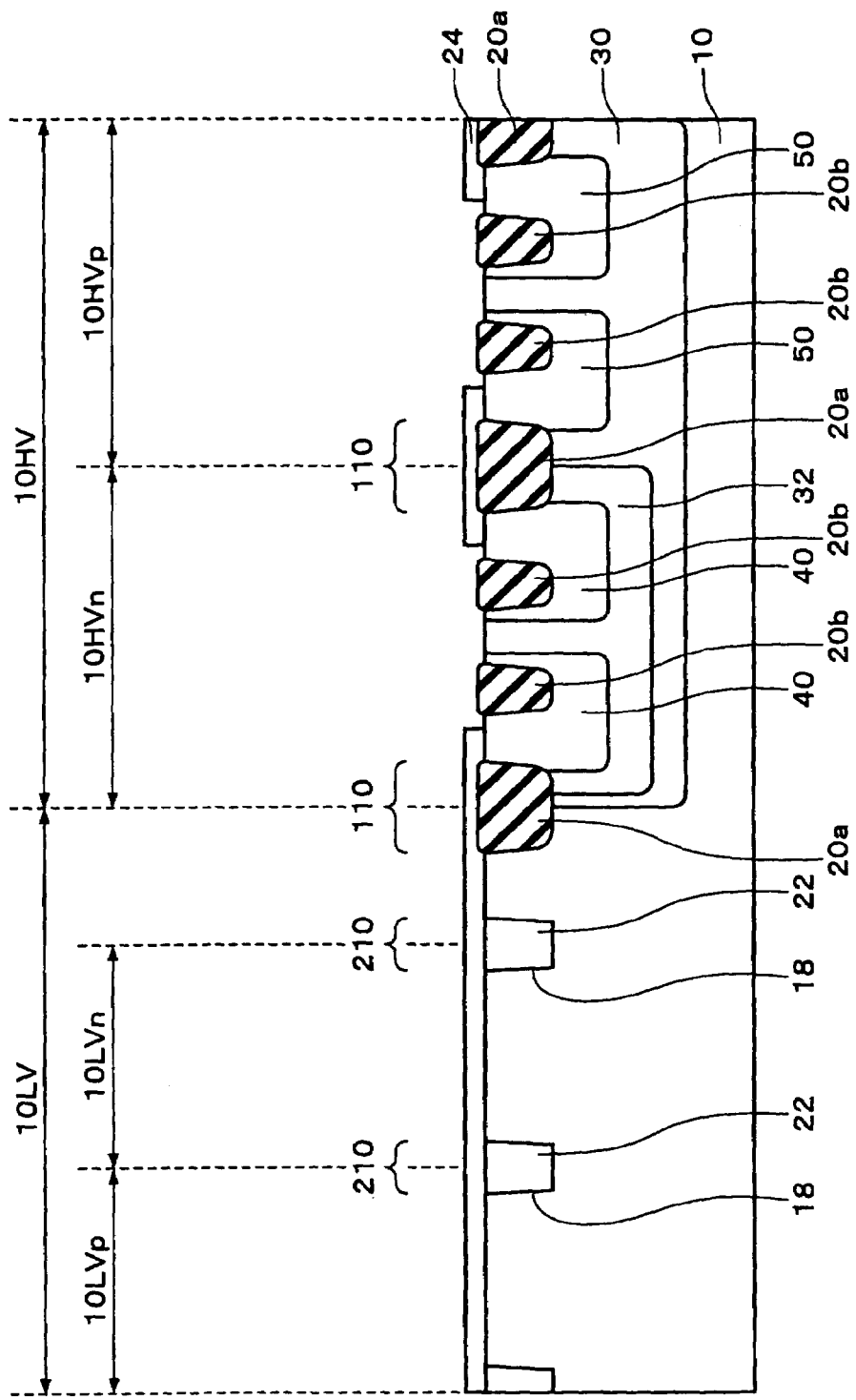
FIG. 11 schematically shows a cross-sectional view illustrating a step in the method for manufacturing a semiconductor device in accordance with the embodiment of the present invention.

Next, as shown in FIG. 11, a protection film 24 is formed to cover regions other than at least regions where gate dielectric layers 60 of the high breakdown voltage transistors 100P and N are to be formed. As the protection film 24, for example, a silicon nitride film may be used. The protection film 24 may be formed as follows. First, a silicon nitride film (not shown) is formed on the entire surface of the semiconductor substrate 10. Then, a resist layer (not shown) having openings in regions where gate dielectric layers 60 are to be formed in a later step is formed, and the silicon nitride film is patterned by using the resist layer as a mask, thereby forming the protection film 24.

Figure 12:
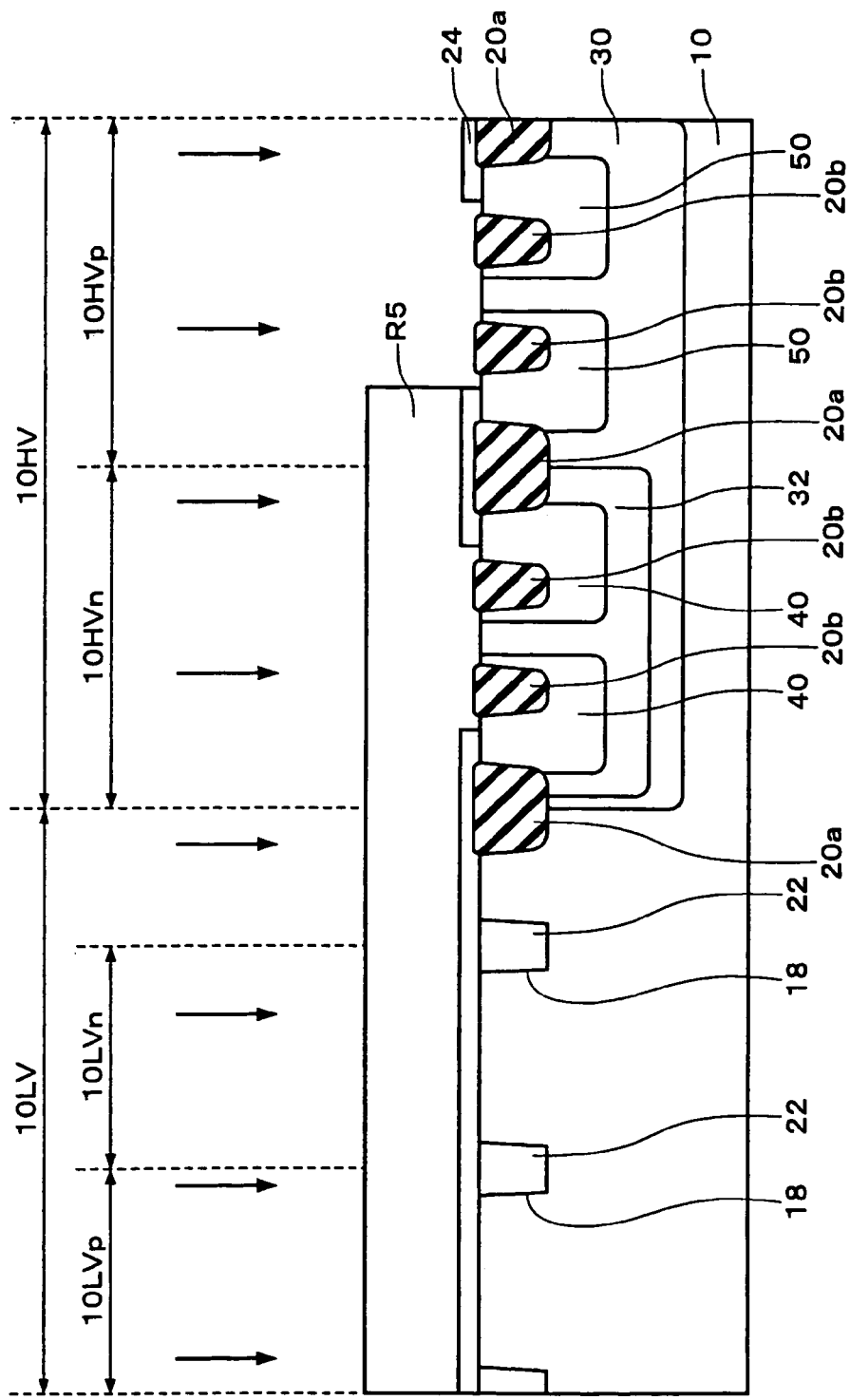
FIG. 12 schematically shows a cross-sectional view illustrating a step in the method for manufacturing a semiconductor device in accordance with the embodiment of the present invention.

Next, channel doping is conducted in the high breakdown voltage transistor forming region 10HV. First, as shown in FIG. 12, a resist layer R5 is formed in a manner to cover regions other than the P-channel high breakdown voltage transistor region 10HVp. By using the resist layer R5 as a mask, P-type impurity, such as, for example, boron is injected. Then, the resist layer R5 is removed by ashing.

Figure 13:
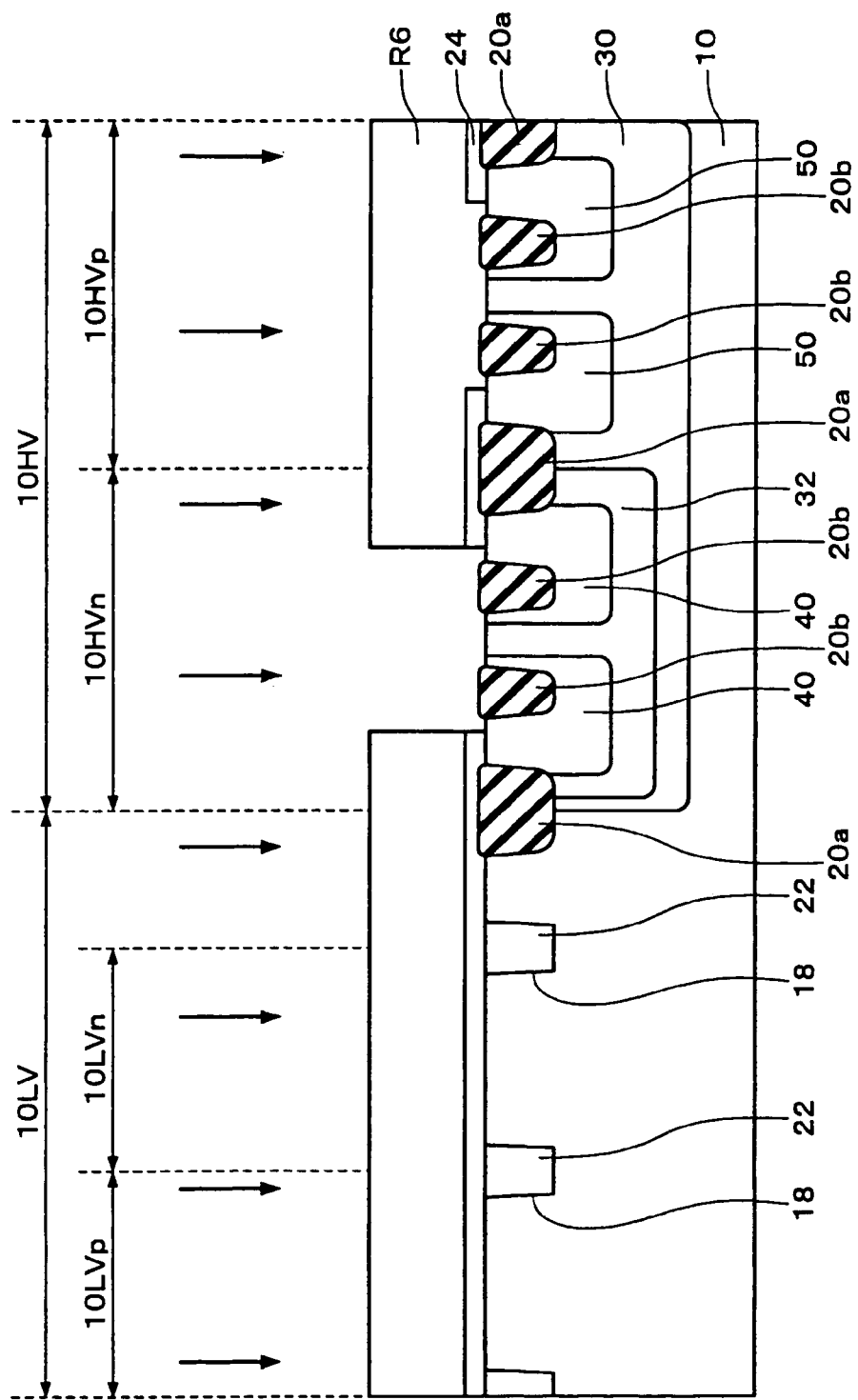
FIG. 13 schematically shows a cross-sectional view illustrating a step in the method for manufacturing a semiconductor device in accordance with the embodiment of the present invention.

Next, as shown in FIG. 13, a resist layer R6 is formed to cover regions other than the N-channel high breakdown voltage transistor region 10HVn. By using the resist layer R6 as a mask, N-type impurity, such as, for example, phosphorous is injected. Then, the resist layer is removed by ashing.

Figure 14:
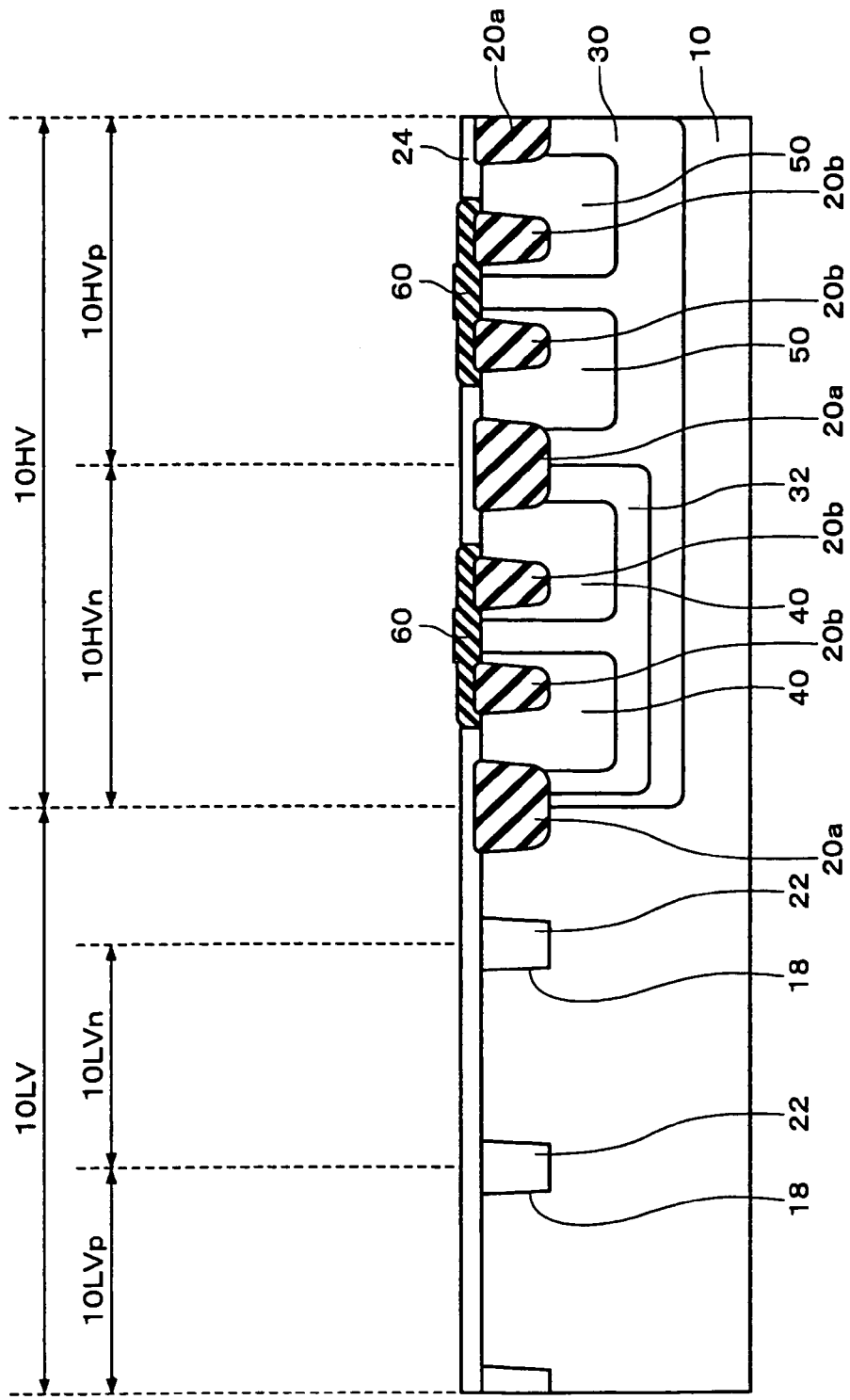
FIG. 14 schematically shows a cross-sectional view illustrating a step in the method for manufacturing a semiconductor device in accordance with the embodiment of the present invention.

Next, as shown in FIG. 14, gate dielectric layers 60 are formed in the high breakdown voltage transistor region 10HV. The gate dielectric layers 60 may be formed by a selective thermal oxidation method. The film thickness of the gate dielectric layers 60 can be, for example, 1600 Å. Then, any remaining portions of the silicon nitride film 26 are removed.

Figure 15:
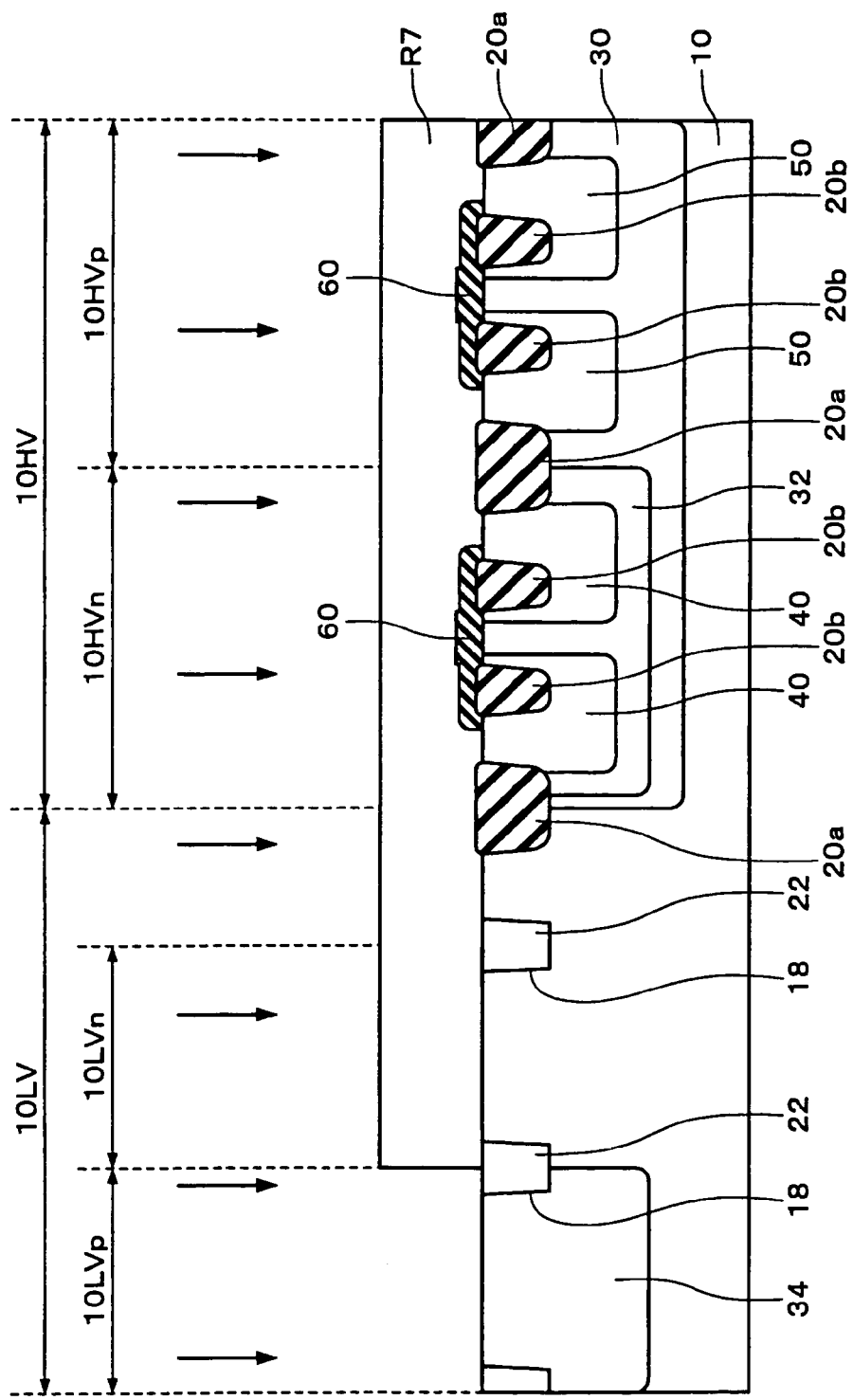
FIG. 15 schematically shows a cross-sectional view illustrating a step in the method for manufacturing a semiconductor device in accordance with the embodiment of the present invention.

Next, as shown in FIG. 15, a well is formed in the low voltage driving transistor region 10LV. First, a resist layer R7 is formed in a manner to cover regions other than the P-channel low voltage driving transistor forming region 10LVp. Then, by using the resist layer R7 as a mask, N-type impurity such as phosphorous, arsenic or the like is injected one time or plural times, thereby forming an N-type well 34. Then, the resist layer R7 is removed.

Figure 16:
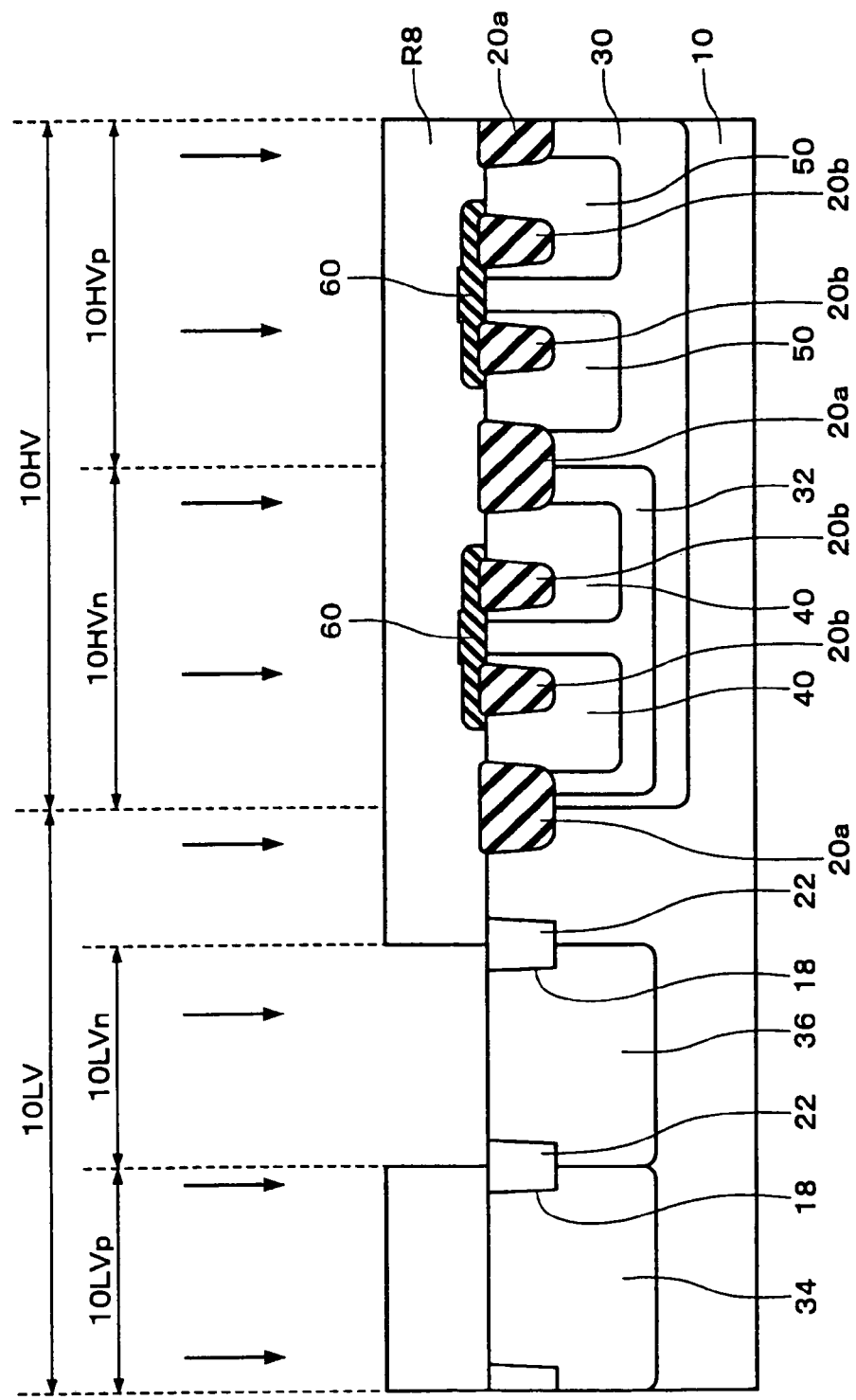
FIG. 16 schematically shows a cross-sectional view illustrating a step in the method for manufacturing a semiconductor device in accordance with the embodiment of the present invention.

Next, as shown in FIG. 16, a resist layer R8 is formed in a manner to cover regions other than the N-channel low voltage driving transistor forming region 10LVn. Then, by using the resist layer R8 as a mask, P-type impurity such as boron or the like is injected one time or plural times, thereby forming a P-type well 36. Then, the resist layer is removed. Then, channel dope may be conducted depending on the requirements.

Figure 17:
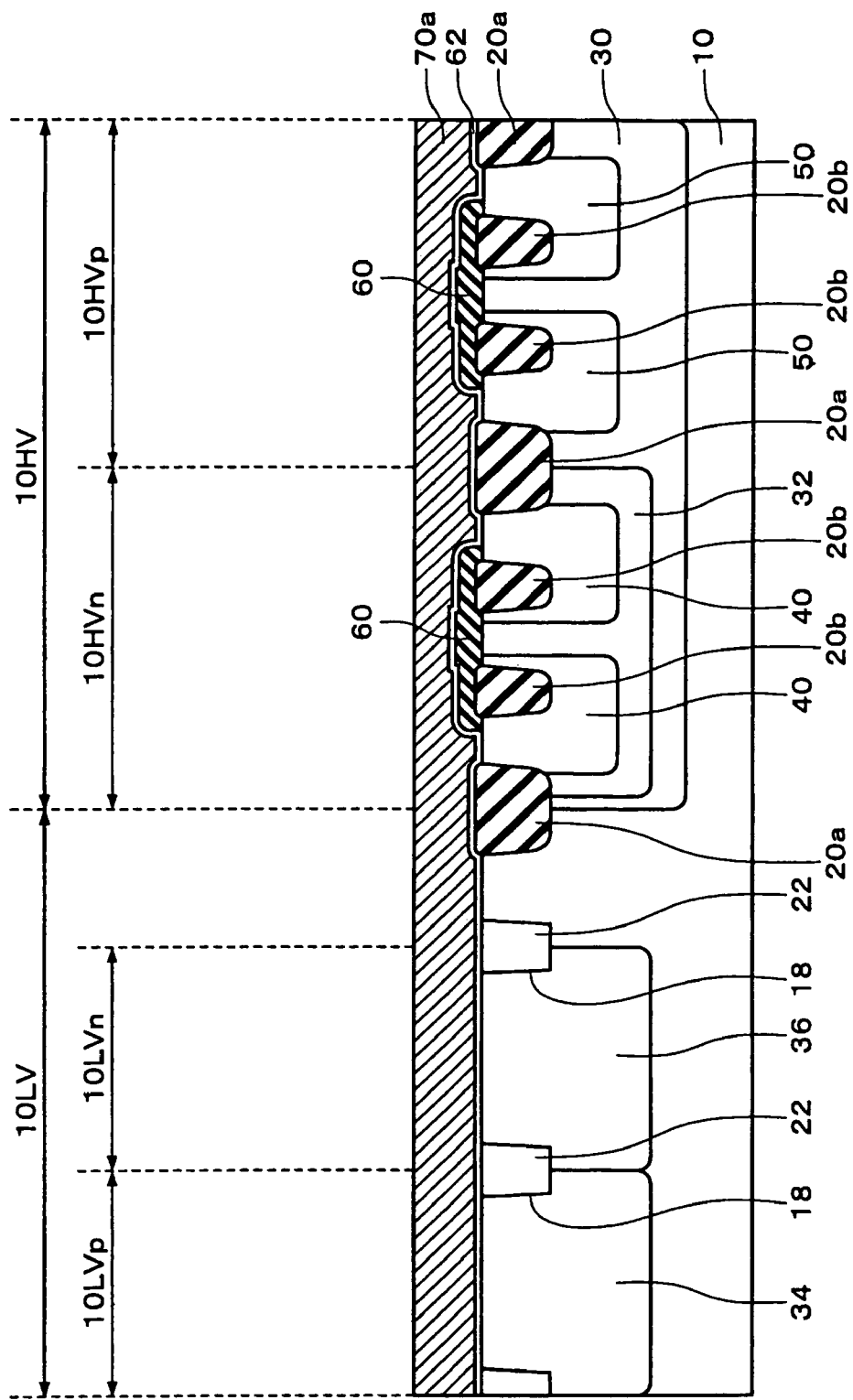
FIG. 17 schematically shows a cross-sectional view illustrating a step in the method for manufacturing a semiconductor device in accordance with the embodiment of the present invention.

Next, as shown in FIG. 17, gate dielectric layers 62 for low voltage driving transistors 200P and N are formed. The gate dielectric layers 62 may be formed by, for example, a thermal oxidation method. The film thickness of the gate dielectric layers 62 can be 45 Å, for example. The gate dielectric layers 62 are also formed in the high breakdown voltage transistor region 10HV.

Then, as shown in FIG. 17, a conductive layer 70a is formed on the entire surface in the high breakdown voltage transistor region 10HV and the low voltage driving transistor region 10LV. As the conductive layer 70a, for example, a polysilicon layer is formed. When a polysilicon layer is formed as the material of the conductive layer 70a, N-type impurity may be injected in regions in the conductive layers 70a which are to become gate electrodes of the N-channel high breakdown voltage transistor 100N and the N-channel low voltage driving transistor 200N, to thereby lower the resistance of the gate electrodes.

Figure 18:
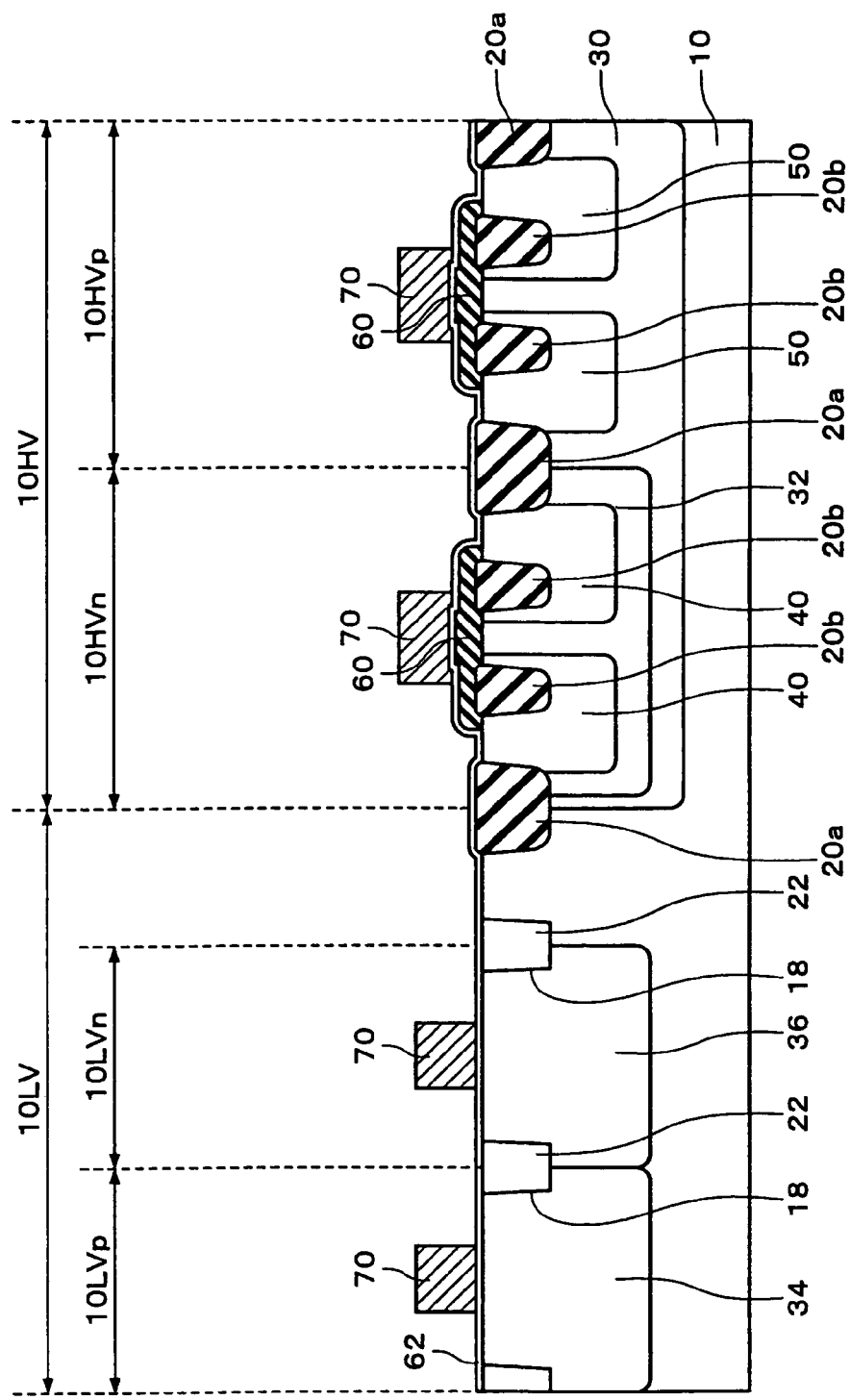
FIG. 18 schematically shows a cross-sectional view illustrating a step in the method for manufacturing a semiconductor device in accordance with the embodiment of the present invention.

Next, a resist layer (not shown) having a specified pattern is formed. By using the resist layer as a mask, the polysilicon layer is patterned, thereby forming gate electrodes 70, as shown in FIG. 18.

Next, low concentration impurity layers 41 and 51 (see FIG. 1) for the respective transistors 200P and N are formed in the low voltage driving transistor region 10LV. The low concentration impurity layers 41 and 51 can be formed through forming a mask layer using a known lithography technique and injecting specified impurity.

Then, by forming a dielectric layer (not shown) on the entire surface and anisotropically etching the dielectric layer, sidewall dielectric layers 72 (see FIG. 1) are formed on side surfaces of the gate electrodes 70.

Then, by introducing P-type impurity in specified regions of the P-channel high breakdown voltage transistor region 10HVp and the P-channel low voltage driving transistor region 10LVp, as shown in FIG. 1, P-type high concentration impurity layers 52 that become source/drain regions outside the sidewall dielectric layers 72 can be formed through a known method.

Then, by introducing N-type impurity in specified regions of the N-channel high breakdown voltage transistor region 10HVn and the N-channel low voltage driving transistor region 10LVn, N-type high concentration impurity layers 42 that become source/drain regions can be formed through a known method.

Advantages of the method for manufacturing a semiconductor device in accordance with the present embodiment will be described below.

By the method for manufacturing a semiconductor device in accordance with the present embodiment, the second element isolation regions 210 in the low voltage driving transistor forming region 10LV are formed by an STI (Shallow Trench Isolation) method, such that a further miniaturization can be achieved. Also, the offset dielectric layers 20b of the high breakdown voltage transistors 100P and N are formed by a semi-recess LOCOS method, which is one example of a selective oxidation method. For this reason, each upper end of the offset dielectric layers 20b can be formed to have a bird's beak configuration. By this, thinning can be suppressed, and the gate dielectric layers 60 of the high breakdown voltage transistors 100P and N can be formed to have a uniform film thickness even at upper ends of the offset dielectric layers 20b. As a result, a semiconductor device that is further miniaturized and has an improved reliability can be manufactured.

By the method for manufacturing a semiconductor device in accordance with the present embodiment, the gate dielectric layers 60 of the high breakdown voltage transistors 100P and N extend to cover the entire surface of the offset dielectric layers 20b and also parts of the semiconductor substrate 10 that are located on both sides of the offset dielectric layers 20b. In other words, their bird's beak sections are covered by the gate dielectric layers 60. For this reason, impurity injection for forming source/drain regions can be done in a self-alignment manner. Also, the protection film 24 is formed to have openings above the channel regions of the high breakdown voltage transistors, the offset dielectric layers 20b and the semiconductor substrate 10 on both sides of the offset dielectric layer 20b, and each gate dielectric layer 60 is formed by a thermal oxidation method to cover the entire upper surfaces of the offset dielectric layers 20b. In other words, the entire offset dielectric layers 20b are thermally oxidized, and the entire offset dielectric layers 20b undergo uniform shape changes, such that defects due to stress in the semiconductor substrate 10 can be reduced. If the gate dielectric layer 60 were formed to cover a part of the offset dielectric layer 20b, heat from the thermal oxidation would not be uniformly applied to the offset dielectric layer 20, and the shape of the offset dielectric layer 20b would become asymmetrical. By this, crystal defects would occur in the semiconductor substrate 10, which would result in defects. However, by the method for manufacturing a semiconductor device in accordance with the present embodiment, a highly reliable semiconductor device can be manufactured without causing such a problem.

By the method for manufacturing a semiconductor device in accordance with the present embodiment, the gate dielectric layers 60 for the high breakdown voltage transistors 100P and N are formed after the trench dielectric layers 22 have been formed. When a dielectric layer with a great film thickness such as the gate dielectric layer 60 is formed on the trench dielectric layers 22, crystal defects might occur due to stress of the trench dielectric layers 22. However, according to the method for manufacturing a semiconductor device in accordance with the present embodiment, when the gate dielectric layers 60 are formed, the trench dielectric layers 22 are covered by the protection film 24 that is a silicon nitride film. Accordingly, the problem described above can be avoided, and a highly reliable semiconductor device can be manufactured.

By the method for manufacturing a semiconductor device in accordance with the present embodiment, when various kinds of impurity layers are formed in the high breakdown voltage transistor forming regions 10HV, heat treatments are conducted; and after the heat treatment have been completed, the trench dielectric layers 22 that are the second element isolation regions 210 are formed. If the trench dielectric layers 22 were placed in an atmosphere for heat treatment to diffuse impurities, their surfaces might be nitrided, or crystal defects might occur. However, by the method for manufacturing a semiconductor device in accordance with the present embodiment, the trench dielectric layers are formed after heat treatments for diffusing impurities of various impurity layers in the high breakdown voltage transistor forming region 10HV have been conducted, such that the problems described above can be avoided, and a highly reliable semiconductor device can be manufactured.

It is noted that the present invention is not limited to the embodiment described above, and many modifications can be made within the scope of the subject matter of the present invention. For example, in the present embodiment, the case that uses a semi-recess LOCOS method is described as a method for forming offset dielectric layers 20b, but the same can be conducted by a LOCOS method.

What is claimed is:

1. A semiconductor device comprising:
   a semiconductor layer;
   a first element isolation region defining a high breakdown voltage transistor forming region in the semiconductor layer;
   a second element isolation region including a trench dielectric layer defining a low voltage driving transistor forming region in the semiconductor layer;
   a high breakdown voltage transistor formed in the high breakdown voltage transistor forming region;
   a low voltage driving transistor formed in the low voltage driving transistor forming region;
   an offset dielectric layer alleviating an electric field of the high breakdown voltage transistor formed in the high breakdown voltage transistor forming region; and
   a gate dielectric layer comprising the high voltage transistor formed on the offset dielectric layer, wherein
   an upper end of the offset dielectric layer is beak shaped and an outer edge of the gate dielectric layer is located between the first element isolation region and an edge of the offset dielectric layer.

2. A semiconductor device according to claim 1, wherein the offset dielectric layer comprises a semi-recess LOCOS layer.

3. A semiconductor device according to claim 1, wherein the first element isolation region comprises a semi-recess LOGOS layer.

4. A semiconductor device according to claim 1, wherein the offset dielectric layer comprises a LOGOS layer.

5. A semiconductor device according to claim 1, wherein the first element isolation region comprises a LOGOS layer.

* * * * *